(12) United States Patent
Xiao et al.

(10) Patent No.: US 11,086,212 B2
(45) Date of Patent: Aug. 10, 2021

(54) MASK AND METHOD FOR MANUFACTURING DISPLAY SUBSTRATE

(71) Applicants: BEIJING BOE DISPLAY TECHNOLOGY CO., LTD., Beijing (CN); BOE TECHNOLOGY GROUP CO., LTD., Beijing (CN)

(72) Inventors: Yu Xiao, Beijing (CN); Jingyang Li, Beijing (CN); Guohua Zhang, Beijing (CN); Dong Wang, Beijing (CN); Yongzhi Song, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 239 days.

(21) Appl. No.: 16/423,912

(22) Filed: May 28, 2019

(65) Prior Publication Data

US 2020/0073227 A1    Mar. 5, 2020

(30) Foreign Application Priority Data

Aug. 31, 2018    (CN) .......................... 201811010166.6

(51) Int. Cl.
*G03F 1/38*    (2012.01)
*G02F 1/13*    (2006.01)
*G02F 1/1339*    (2006.01)

(52) U.S. Cl.
CPC .............. *G03F 1/38* (2013.01); *G02F 1/1303* (2013.01); *G02F 1/1339* (2013.01)

(58) Field of Classification Search
CPC ........................................................ G03F 1/38
See application file for complete search history.

(56) References Cited

U.S. PATENT DOCUMENTS

| 9,978,595 B2 | 5/2018 | Lee et al. |
| 10,394,081 B2 | 8/2019 | Cao et al. |
| 10,571,751 B2 | 2/2020 | Xiao et al. |

(Continued)

FOREIGN PATENT DOCUMENTS

| CN | 202522841 U | 11/2012 |
| CN | 102819147 A | 12/2012 |

(Continued)

OTHER PUBLICATIONS

First Office Action, including Search Report, for Chinese Patent Application No. 201811010166.6, dated Apr. 2, 2021, 19 pages.

*Primary Examiner* — Edmond C Lau
(74) *Attorney, Agent, or Firm* — Westman, Champlin & Koehler, P.A.

(57) ABSTRACT

A mask and a method for manufacturing a display substrate are provided. The mask includes a transparent substrate and a light shielding layer on the transparent substrate. The light shielding layer include a first opening pattern, and the transparent substrate includes a first region, where an orthographic projection of the first region onto the light shielding layer overlaps the first opening pattern, and a light converging structure is provided at least part of a marginal region of the first region, and is constructed in such a manner that light incident on the at least part of the marginal region converges to a central region of the first opening pattern.

18 Claims, 5 Drawing Sheets

(56) References Cited

U.S. PATENT DOCUMENTS

| | | | |
|---|---|---|---|
| 2009/0311612 A1* | 12/2009 | Kitahata | ............... G03F 1/70 430/5 |
| 2012/0314144 A1 | 12/2012 | Sugita et al. | |
| 2016/0085104 A1 | 3/2016 | Zhang | |
| 2017/0038617 A1 | 2/2017 | Cao et al. | |
| 2017/0194139 A1 | 7/2017 | Lee et al. | |
| 2019/0121179 A1 | 4/2019 | Xiao et al. | |

FOREIGN PATENT DOCUMENTS

| | | |
|---|---|---|
| CN | 104238199 A | 12/2014 |
| CN | 104317160 A | 1/2015 |
| CN | 105093618 A | 11/2015 |
| CN | 105093813 A | 11/2015 |
| CN | 105824189 A | 8/2016 |
| CN | 107195540 A | 9/2017 |
| CN | 107463064 A | 12/2017 |

\* cited by examiner

MASK AND METHOD FOR MANUFACTURING DISPLAY SUBSTRATE

CROSS-REFERENCE TO RELATED APPLICATION

This application claims a priority to Chinese Patent Application No. 201811010166.6 filed on Aug. 31, 2018, the disclosure of which is incorporated in its entirety by reference herein.

TECHNICAL FIELD

The present disclosure relates to the field of display technology, in particular to a mask and a method for manufacturing a display substrate.

BACKGROUND

Thin film transistor liquid crystal display (TFT-LCD) is dominant in the market due to its advantages such as high display quality, high space utilization rate, low power consumption and no radiation. In a liquid crystal display panel, a liquid crystal cell is formed by a color filter substrate and an array substrate opposite to each other, and a photo spacer (Photo Spacer, PS) plays a critical role in ensuring thickness uniformity of the liquid crystal cell.

SUMMARY

A mask is provided according to some embodiments of the present disclosure, which includes:

a transparent substrate and a light shielding layer on the transparent substrate, where the light shielding layer include a first opening pattern;

where the transparent substrate includes a first region, where an orthographic projection of the first region onto the light shielding layer overlaps the first opening pattern, a light converging structure is provided at least part of a marginal region of the first region, and the light converging structure is constructed in such a manner that light incident on the at least part of the marginal region converges to a central region of the first opening pattern.

In some embodiments, a horizontal cross section of the first opening pattern parallel with a plane where the light shielding layer is located is rectangular, and a width of the central region of the first opening pattern is ⅖ to ⅘ of a width of the first opening pattern.

In some embodiments, the horizontal cross section of the first opening pattern parallel with a plane where the light shielding layer is located is circular, and a width of the central region of the first opening pattern is ⅖ to ⅘ of a width of the first opening pattern.

In some embodiments, the light converging structure is a groove at a top surface of the first region, and the top surface is a surface of the first region far away from the first opening pattern.

In some embodiments, the first region is a cuboid, a vertical cross section of the groove perpendicular to a plane where the light shielding layer is located is a right triangle, a first leg of the right triangle is at the top surface of the first region, and a second leg of the right triangle is perpendicular to the top surface of the first region.

In some embodiment, the first region is a cylinder, a vertical cross section of the groove perpendicular to a plane where the light shielding layer is located is a right triangle, a first leg of the right triangle is at the top surface of the first region, and a second leg of the right triangle is perpendicular to the top surface of the first region.

In some embodiments, the second leg is at a side surface of the cuboid.

In some embodiments, the second leg is at a side surface of the cylinder.

In some embodiments, dimensions of the right triangle are determined based on the following equations:

$\text{Tan } \alpha = y/x;$ $\text{Sin } \alpha/\text{Sin } \beta = n;$ $\text{Tan}(\alpha-\beta) = L1/(h-y);$ $\text{Tan}(\alpha-\beta) = (L1+L2-x)/h;$ where x is the first leg, y is the second leg, n is a relative refractive index for light obliquely incident into the transparent substrate from air, L2 is the width of the central region of the first opening pattern, L1 is equal to $(L-L2)/2$, L is the width of the first opening pattern, h is a thickness of the transparent substrate, α is an included angle between light incident on a hypotenuse of the right triangle and a normal line, and β is an included angle between refracted light entering the first region from the hypotenuse of the right triangle and the normal line.

In some embodiments, the first region is a cuboid, a vertical cross section of the groove perpendicular to a plane where the light shielding layer is located is bounded by a first edge, a second edge and a third edge, the first edge is a straight line at the top surface of the first region, the second edge is a straight line perpendicular to the top surface of the first region, and the third edge is a curve connecting the first edge and the second edge.

In some embodiments, the first region is a cylinder, a vertical cross section of the groove perpendicular to a plane where the light shielding layer is located is bounded by a first edge, a second edge and a third edge, the first edge is a straight line at the top surface of the first region, the second edge is a straight line perpendicular to the top surface of the first region, and the third edge is a curve connecting the first edge and the second edge.

In some embodiments, the mask further includes a partially light-transmissive film at the first opening pattern, and the light shielding layer further includes a second opening pattern.

In some embodiments, the quantity of the first opening pattern is more than one, and the mask further includes a partially light-transmissive film at least part of the more than one first opening patterns.

In some embodiments, the width of the first opening pattern is greater than or equal to 30 μm.

In some embodiments, the transparent substrate is made of a glass material, and the light shielding layer is made of a metal material.

In some embodiments, the light converging structure is at the whole of the marginal region of the first region.

A method for manufacturing a display substrate is further provided according to some embodiments of the present disclosure, which includes forming a photo spacer with the mask described above.

BRIEF DESCRIPTION OF THE DRAWINGS

In order to clarify the technical solutions according to the embodiments of the present disclosure, the drawings used in the description of the embodiments are briefly introduced hereinafter. Apparently, the drawings merely illustrate some embodiments of the present disclosure, and other drawings may be obtained based on these drawings by those skilled in the art without any creative efforts.

DETAILED DESCRIPTION

In order that the objective, technical solutions and advantages of embodiments of the present disclosure can be clearer, the technical solutions according to the embodiments of the present disclosure are clearly and completely described hereinafter in conjunction with the drawings. Apparently, the described embodiments are merely some rather than all embodiments of the present disclosure, and other embodiments obtained by those skilled in the art based on the embodiments in the present disclosure shall fall within the protection scope of the present disclosure.

Figure 1:
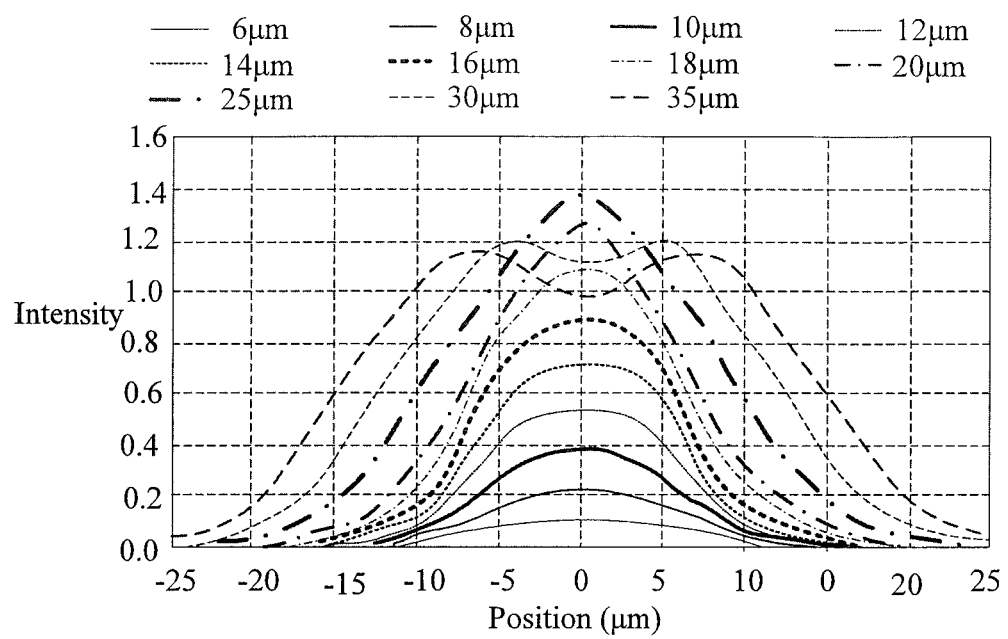
FIG. 1 is a schematic diagram of a light intensity distribution for half-tone masks openings of different sizes.

In related technologies, in a case of manufacturing a photo spacer with a half-tone mask, a light transmittance of an opening of the half-tone mask is a definite value. In a case of a fixed exposure gap (the gap is 200 μm is FIG. 1), light intensity distribution for half-tone masks with different openings are shown in FIG. 1. In a case that a dimension of an opening of a half-tone mask is 30 μm or 35 μm, light incident near two ends of the opening has a minimum light intensity, and the light intensity gradually increases from the two ends of the opening to the center. However, as can be seen from FIG. 1, a light intensity of a central region of the opening is abnormally lower than that of a neighboring region. This peculiar light intensity distribution leads to a crater-like profile of the photo spacer, and the greater a critical dimension (CD) of the mask is, the more crater-like the profile of the photo spacer is.

Figure 2:
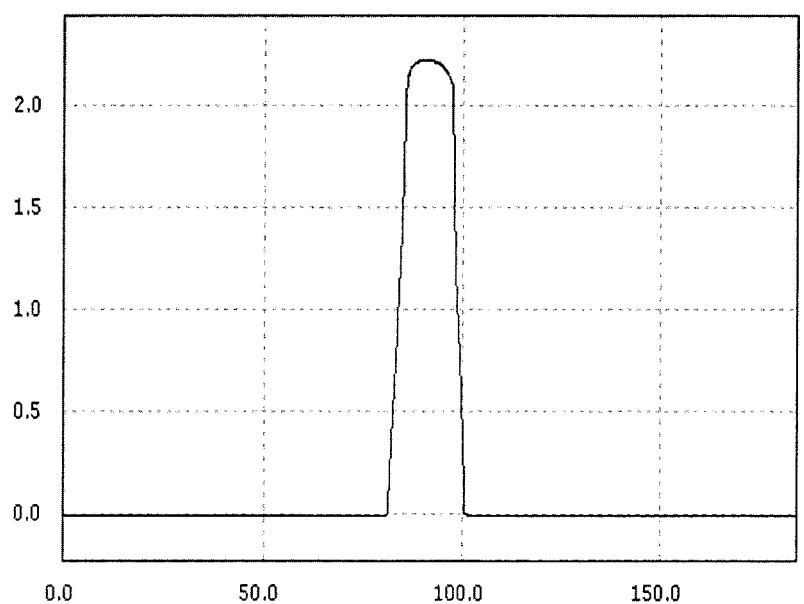
FIG. 2 is a schematic diagram showing a profile of a photo spacer formed with a half-tone mask with a 25 μm wide opening.
Figure 3:
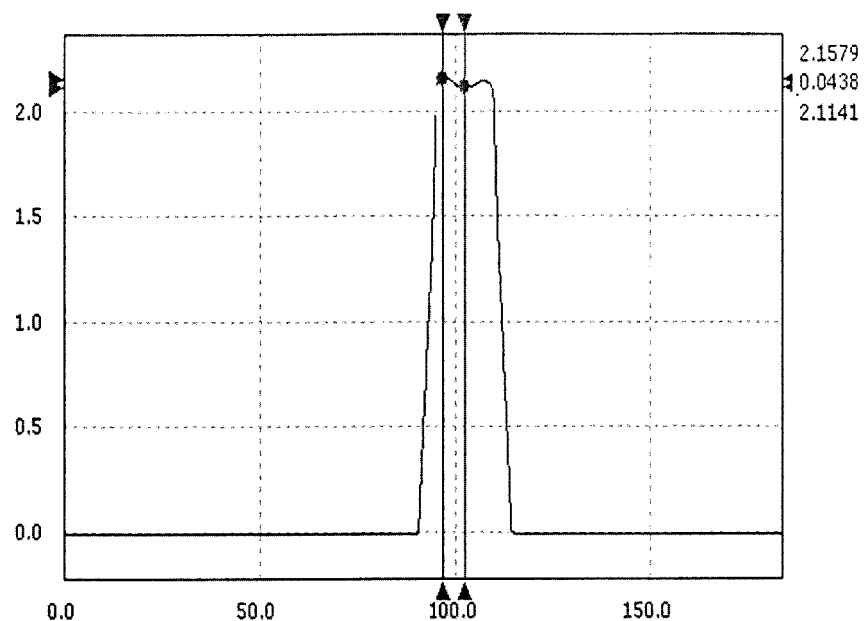
FIG. 3 is a schematic diagram showing a profile of a photo spacer formed with a half-tone mask with a 30 μm wide opening.
Figure 4:
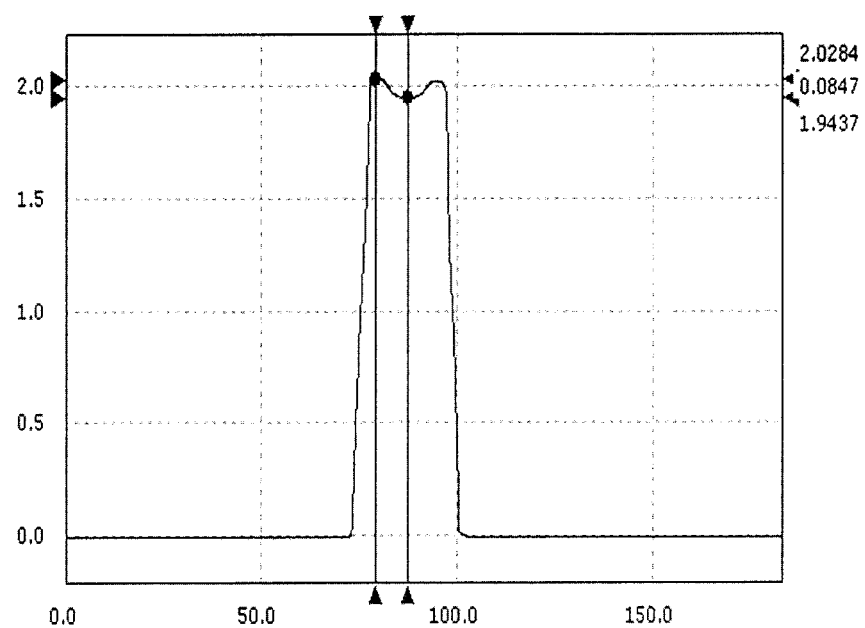
FIG. 4 is a schematic diagram showing a profile of a photo spacer formed with a half-tone mask with a 35 μm wide opening.

FIGS. 2 to 4 show profiles of photo spacers formed with half-tone masks having different openings. From FIGS. 2 to 4, a photo spacer profile is normal in a case of a half-tone mask with an opening with a width of 25 μm; and the photo spacer profile becomes crater-like in a case that the width of the opening increases to 30 μm or 35 μm, where the wider the opening is, the worse the photo spacer profile is.

As the support functionality of a photo spacer with a crater-like profile is severely compromised, mechanical abnormalities such as touch mura may be caused, affecting product quality.

A film layer pattern formed with a mask in the related technologies is likely to have a crater-like profile. In view of this, a mask, a display substrate and a method for manufacturing a display substrate are provided according to embodiments of the present disclosure.

Figure 5:
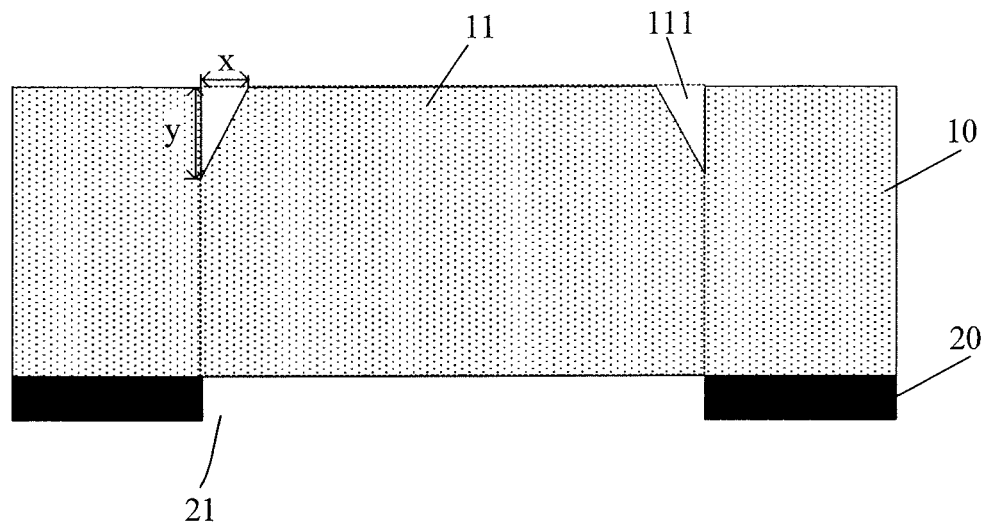
FIG. 5 is a schematic structural diagram of a mask according to some embodiments of the present disclosure.

Reference is made to FIG. 5, which is a schematic structural diagram of a mask according to some embodiments of the present disclosure. The mask includes a transparent substrate 10 and a light shielding layer 20 on the transparent substrate 10. The light shielding layer 20 has a first opening pattern 21. The transparent substrate 10 includes a first region 11 (the region enclosed by the dotted box in FIG. 5). The first region 11 is aligned to the first opening pattern 21, and an orthographic projection of the first region 11 onto the light shielding layer 20 overlaps the first opening pattern 21 (for example, as shown in FIG. 5, the orthographic projection of the first region 11 onto the light shielding layer 20 completely overlaps the first opening pattern 21). A light converging structure 111 is provided at least part of a marginal region of the first region 11, and is configured to converge light incident on the at least part of the marginal region to a central region of the first opening pattern 21.

Figure 6:
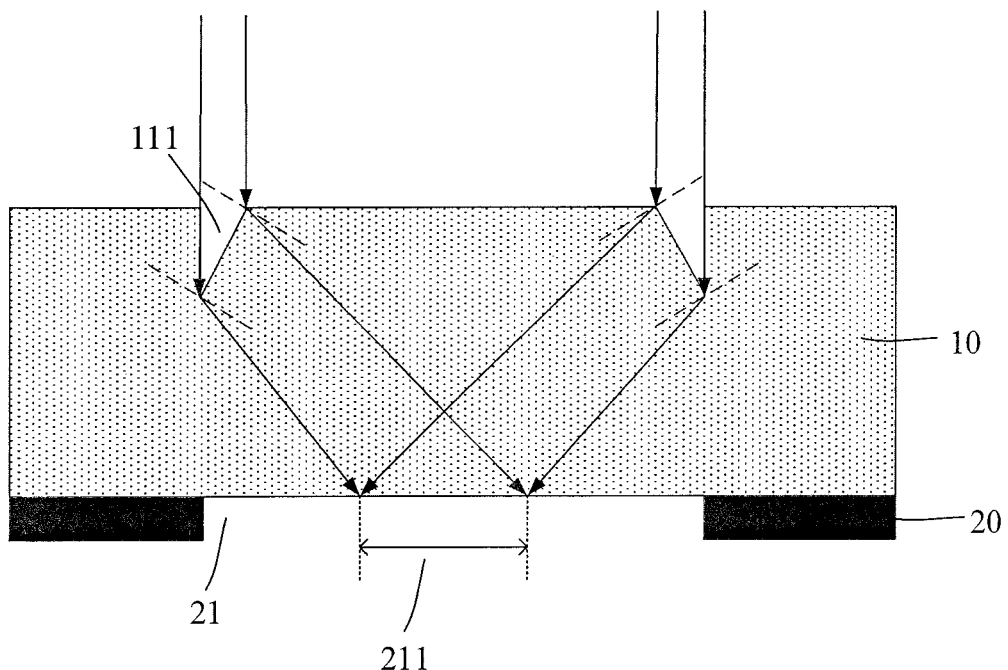
FIG. 6 is a schematic diagram showing an optical path in the mask shown in FIG. 5.

Reference is made to FIG. 6, which a schematic diagram showing an optical path in the mask shown in FIG. 5. From FIG. 6, in a case that light is incident on the light converging structure 111, the light converging structure 111 will converge the incident light to a central region 211 of the first opening pattern 21.

In the embodiments of the present disclosure, light incident on the marginal region of the opening can be converged to the central region of the opening by providing the light converging structure at the marginal region of the opening of the mask, thereby compensating for the lack of light intensity in the central region and avoiding forming film layer patterns with crater-like profiles.

In some embodiments of the present disclosure, the transparent substrate 10 may be made of a transparent material, for example, glass, and the light shielding layer 20 may be made of an opaque material, for example, metal. The light shielding layer 20 is formed on a bottom surface of the transparent substrate 10, and may be provided with multiple first opening patterns 21. The bottom surface is a surface of the transparent substrate 10 far away from the light converging structure 111.

In some embodiments of the present disclosure, the light converging structure 111 may be arranged at a part of the marginal region of the first region 11, and in some embodiments, the light converging structure 111 is arranged at the whole of the marginal region of the first region 11 so that light incident on the whole of the marginal region can be converged to the central region of the opening, thereby further compensating for the lack of light intensity in the central region.

In some embodiments of the present disclosure, the light converging structure 111 may be of various types, as long as it can converge light incident on the first region 11 to the central region 211 of the first opening pattern 21.

In some embodiments of the present disclosure, a horizontal cross section of the first opening pattern 21 may be a rectangle, where the rectangle may be an oblong or a square.

In some embodiments, a width of the central region of the first opening pattern is ⅖-⅘ of a width of the first opening pattern. The term width herein refers to a width of a long edge of a rectangle. In a case that the horizontal cross section of the first opening pattern 21 is a rectangle, the first region 11 is a cuboid. The horizontal cross section refers to an intersection of the mask with a plane that is parallel with a plane where the mask is located.

In some other embodiments of the present disclosure, the horizontal cross section of the first opening pattern 21 may be a circle. In some embodiments, the width of the central region of the first opening pattern is ⅖-⅘ of the width of the first opening pattern. The term width herein refers to a diameter of a circle. In a case that the horizontal cross section of the first opening pattern 21 is a circle, the first region 11 is a cylinder.

In the embodiment as illustrated by FIG. 5, the light converging structure 111 is a groove at a top surface of the first region 11, where the top surface is a surface of the first region 11 far away from the first opening pattern 21. In some embodiments of the present disclosure, the light converging structure 111 may be formed by directly forming a groove at the top surface of the first region, which is simple in manufacture without requiring any additional components and has a low cost.

In some other embodiments of the present disclosure, the light converging structure 111 may be any other structure, for example, an optical component arranged at a marginal region of the top surface of the first region 11.

In some embodiments of the present disclosure, a shape of the groove serving as the light converging structure 111 is not limited, as long as it can converge light incident on the groove to the central region 211 of the first opening pattern 21.

In the embodiment as illustrated by FIG. 5, the first region 11 is a cuboid or a cylinder, and a vertical cross section of the groove is a right triangle, where a first leg x of the right triangle is at the top surface of the first region 11 and a second leg y is perpendicular to the top surface of the first region 11. In the embodiments of the present disclosure, the vertical cross section refers to an intersection of the mask with a plane that is perpendicular to the plane where the mask is located. In the embodiments of the present disclosure, light incident on a hypotenuse of the right triangle is refracted and converged to the central region of the firs opening pattern 21, and desirable light converging performance can be achieved with this structure.

In the embodiment as illustrated by FIG. 5, the second leg y is at a side surface of the cuboid or the cylinder, that is, the groove is near the extreme edge of the first region, thereby maximumly avoiding influence on transmission of light in other regions.

In a case that the vertical cross section of the groove is a right triangle, dimensions of the right triangle are determined by the following method.

Following clarifications are made before entering the method for calculating the dimensions of the right triangle:

1) in the embodiments of the present disclosure, according to the diagram of light intensity distribution for mask opening and measured results, a crater of a film layer pattern is located at a central region of the opening of the mask and occupies ⅖-⅘ of a width of the whole opening. That is, the incident light can cover the region after being deflected by the marginal region of the mask. Accordingly, in some embodiments, the width of the central region of the first opening pattern is ⅖-⅘ of the width of the first opening pattern.

2) as a thickness (for example, typically about 13 mm) of the transparent substrate is far greater than a distance (for example, typically about 0.2 mm) between a bottom surface of the mask and a top surface of the film layer pattern, the bottom surface of the mask has little influence on direction of the incident light and key considerations should be given to the influence of a top surface of the mask on the direction deflection of the incident light.

3) in a case that light is obliquely incident from a medium into another medium, an incidence angle $\alpha$ and a refraction angle $\beta$ meet the refraction equation $\sin \alpha/\sin \beta = n$, where n is a ratio between refractive indexes the two media.

Figure 7:
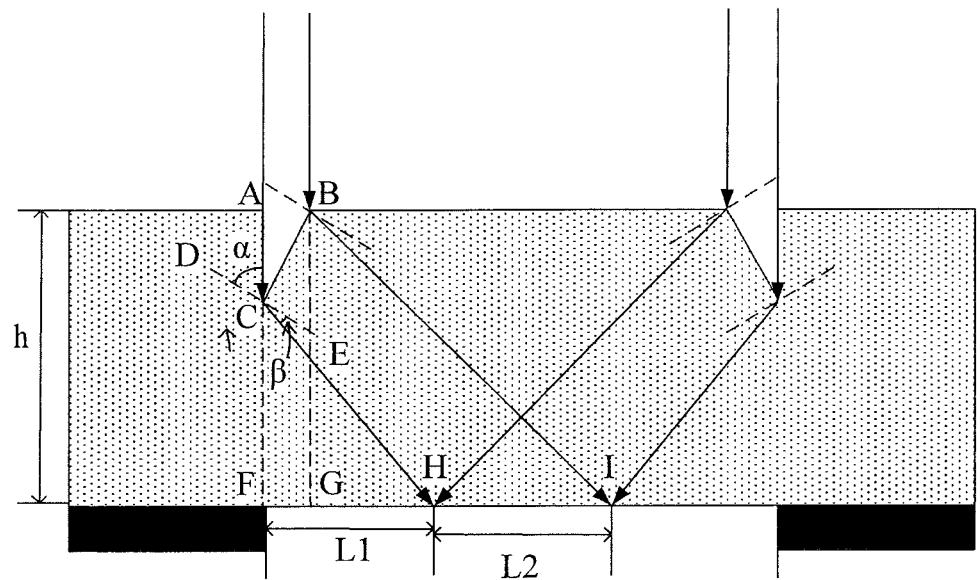
FIG. 7 is a schematic diagram showing dimensions of a light converging structure in a mask according to some embodiments of the present disclosure.

With reference to FIG. 7, dimensions of a right triangle at a left margin of the first region are calculated for example, and dimensions of a right triangle at a right margin can be calculated in the same way, which is not repeated herein.

Known quantities: 1), the width L of the first opening pattern, and the width L2 of the central region of the first opening pattern, where L is in a range of (⅖ to ⅘)L and L=L2+2L1, that is, L1 is equal to (L−L2)/2; 2), the thickness h of the transparent substrate; and 3), a relative refractive index n for light obliquely incident into the transparent substrate from air.

Unknown quantities: 1), a length x of the first leg AB of the right triangle; 2), a length y of the second leg AC of the right triangle; 3), a value $\alpha$ of an included angle ∠DCA between light incident on the hypotenuse of the right triangle and a normal line; and 4), a value $\beta$ of an include angle ∠ECH between refracted light entering the first region from the hypotenuse of the right triangle and the normal line.

The following can be derived with reference to the above:
1), in the triangle Δ ABC, $\tan \alpha = y/x$;
2), according to the law of refraction, $\sin \alpha/\sin \beta = n$;
3), in the triangle Δ CFH, $\tan (\alpha - \beta) = L1/(h-y)$; and
4), in the triangle Δ BGI, $\tan (\alpha - \beta) = (L1+L2-x)/h$.

The unknown quantities x, y, $\alpha$ and $\beta$, that is, the dimensions of the right triangle, can be calculated by the four equations above.

Figure 8:
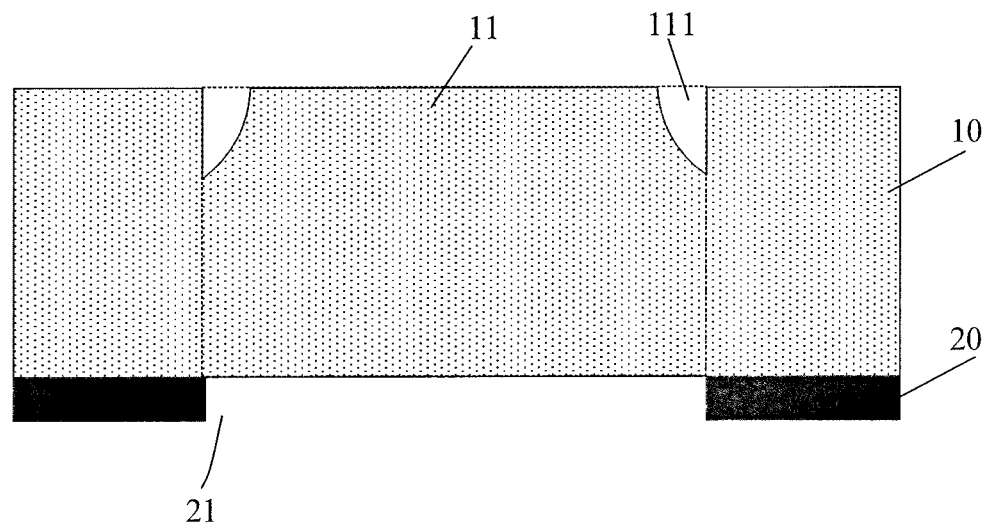
FIG. 8 is a schematic structural diagram of a mask according to some embodiments of the present disclosure.

The vertical cross section of the groove is not limited to right triangle, which may also have other shapes, as is shown in FIG. 8.

Figure 9:
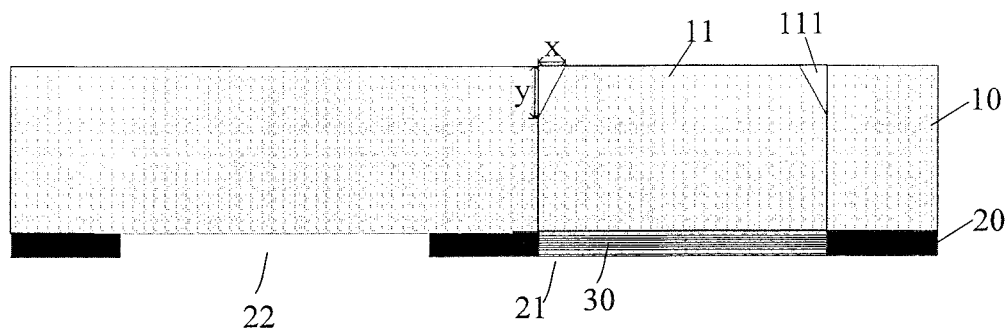
FIG. 9 is a schematic structural diagram of a mask according to some embodiments of the present disclosure.

Reference is made to FIG. 9, which is a schematic structural diagram of a mask according to some other embodiments of the present disclosure. The mask further includes a partially light-transmissive film 30 at the first opening pattern 21, and the first opening pattern is used to form an auxiliary photo spacer. As shown in FIG. 9, in some embodiments of the present disclosure, the light shielding layer 20 further has a second opening pattern 22, where the second opening pattern 22 is not provided with the partially light-transmissive film 30 and is used to form a main photo spacer. In some embodiments of the present disclosure, the mask is a gray-tone mask or a half-tone mask, a region where the first opening pattern 21 is located is partially light-transmissive, with which the formed auxiliary photo spacer is likely to have a crater-like profile. In view of this, in the embodiments of the present disclosure, the light converging structure 111 is provided for the partially light-transmissive region, which converges light incident on the marginal region of the opening to the central region of the first opening pattern 21, thereby compensating for lack of light intensity in the central region and avoiding forming an auxiliary photo spacer with a crater-like profile. In this way, mechanical abnormalities of a display panel such as touch mura due to insufficient support strength of the photo spacer can be avoided, thereby improving display quality.

Figure 10:
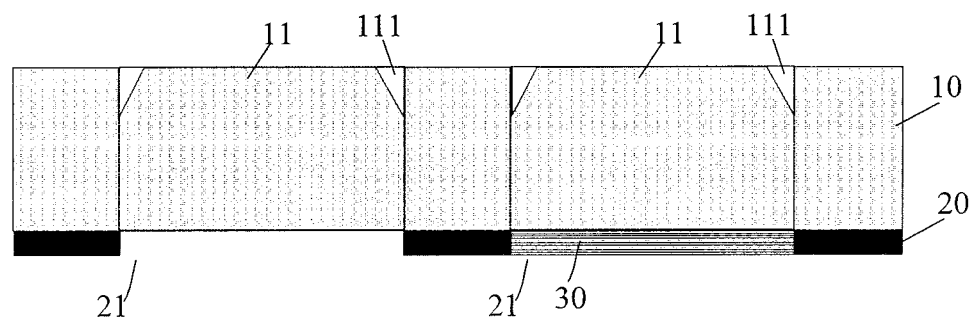
FIG. 10 is a schematic structural diagram of a mask according to some embodiments of the present disclosure.

Reference is made to FIG. 10, which is a schematic structural diagram of a mask according to some embodiments of the present disclosure. The number of the first opening pattern 21 is more than one, and the mask further includes a partially light-transmissive film 30 at some of the first opening patterns 21.

Figure 11:
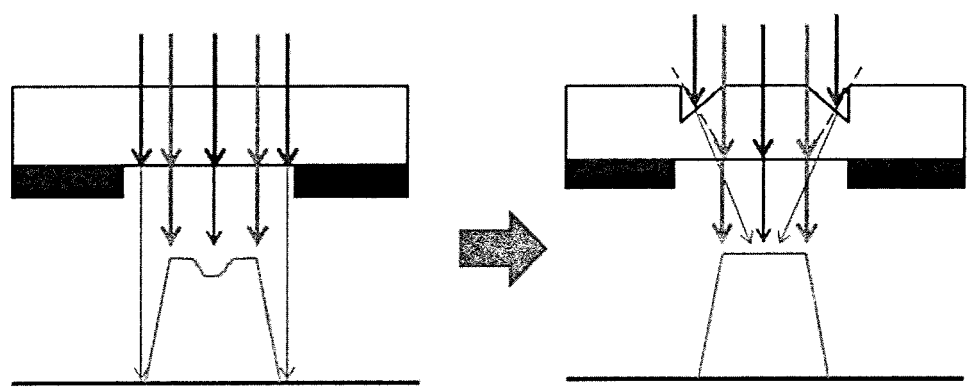
FIG. 11 is a diagram of comparison between profiles of photo spacers respectively formed with a mask in related technologies and a mask according to some embodiments of the present disclosure.

Reference is made to FIG. 11, which is a diagram of comparison between profiles of photo spacers respectively formed with the mask in the related technologies and the mask according to the embodiments of the present disclosure. From FIG. 11, in forming a photo spacer with the mask according to the present disclosure, as light at the marginal region of the opening is converged to the central region of the opening and lack of light intensity in the central region can be compensated, the formed photo spacer has a flat top surface instead of a crater-like profile.

In the above embodiments of the present disclosure, the width of the first opening pattern may be greater than or equal to 30 microns (μm), since for a first opening pattern with a width greater than or equal to 30 μm, a formed film layer pattern is easily subject to a situation where light intensity through a central region thereof is lower than that through a neighboring region.

A method for manufacturing a display substrate is further provided according to some embodiments of the present disclosure, which includes forming a photo spacer with the mask according to any of the foregoing embodiments.

In some embodiments, the display substrate may be a color filter substrate.

A display substrate is further provided according to some embodiments of the present disclosure, which includes a photo spacer formed by the method according to the embodiments above.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, and are merely used to distinguish different components. Such terms as "connected", "connected with" and the like are not limited to physical or mechanical connections, and may include electrical connections, whether direct or indirect. Such terms as "on", "under", "left", "right" and the like are only used to represent a relative position relationship, and when an absolute position of a described object is changed, the relative position relationship may also be changed accordingly.

The above descriptions illustrate some embodiments of the present disclosure. It should be noted that various improvements and modifications may be made by those skilled in the art without departing from the principle of the present disclosure, and these improvements and modifications shall also fall within the protection scope of the present disclosure.

What is claimed is:

1. A mask, comprising:
    a transparent substrate; and
    a light shielding layer on the transparent substrate, wherein the light shielding layer comprises a first opening pattern;
    wherein the transparent substrate comprises a first region, an orthographic projection of the first region onto the light shielding layer overlaps the first opening pattern, a light converging structure is provided at least part of a marginal region of the first region, and the light converging structure is constructed in such a manner that light incident on the at least part of the marginal region converges to a central region of the first opening pattern.

2. The mask according to claim 1, wherein a horizontal cross section, parallel with a plane where the light shielding layer is located, of the first opening pattern is rectangular, and a width of the central region of the first opening pattern is ⅖ to ⅘ of a width of the first opening pattern.

3. The mask according to claim 1, wherein a horizontal cross section, parallel with a plane where the light shielding layer is located, of the first opening pattern is circular, and a width of the central region of the first opening pattern is ⅖ to ⅘ of a width of the first opening pattern.

4. The mask according to claim 1, wherein the light converging structure is a groove at a top surface of the first region, and the top surface is a surface of the first region far away from the first opening pattern.

5. The mask according to claim 4, wherein the first region is a cuboid, a vertical cross section, perpendicular to a plane where the light shielding layer is located, of the groove is a right triangle, a first leg of the right triangle is at the top surface of the first region, and a second leg of the right triangle is perpendicular to the top surface of the first region.

6. The mask according to claim 4, wherein the first region is a cylinder, a vertical cross section, perpendicular to a plane where the light shielding layer is located, of the groove is a right triangle, a first leg of the right triangle is at the top surface of the first region, and a second leg of the right triangle is perpendicular to the top surface of the first region.

7. The mask according to claim 5, wherein the second leg is at a side surface of the cuboid.

8. The mask according to claim 6, wherein the second leg is at a side surface of the cylinder.

9. The mask according to claim 5, wherein dimensions of the right triangle are determined based on the following equations:

$$\text{Tan } \alpha = y/x;$$

$$\text{Sin } \alpha/\text{Sin } \beta = n;$$

$$\text{Tan}(\alpha-\beta) = L1/(h-y);$$

$$\text{Tan}(\alpha-\beta) = (L1+L2-x)/h;$$

where x is the first leg, y is the second leg, n is a relative refractive index for light obliquely incident into the transparent substrate from air, L2 is a width of the central region of the first opening pattern, L1 is equal to (L−L2)/2, L is a width of the first opening pattern, h is a thickness of the transparent substrate, α is an included angle between light incident on a hypotenuse of the right triangle and a normal line, and β is an included angle between refracted light entering the first region from the hypotenuse of the right triangle and the normal line.

10. The mask according to claim 6, wherein dimensions of the right triangle are determined based on the following equations:

$$\text{Tan } \alpha = y/x;$$

$$\text{Sin } \alpha/\text{Sin } \beta = n;$$

$$\text{Tan}(\alpha-\beta) = L1/(h-y);$$

$$\text{Tan}(\alpha-\beta) = (L1+L2-x)/h;$$

where x is the first leg, y is the second leg, n is a relative refractive index for light obliquely incident into the transparent substrate from air, L2 is a width of the central region of the first opening pattern, L1 is equal to (L−L2)/2, L is a width of the first opening pattern, h is a thickness of the transparent substrate, α is an included angle between light incident on a hypotenuse of the right triangle and a normal line, and β is an included angle between refracted light entering the first region from the hypotenuse of the right triangle and the normal line.

11. The mask according to claim 4, wherein the first region is a cuboid, a vertical cross section, perpendicular to a plane where the light shielding layer is located, of the groove is bounded by a first edge, a second edge and a third edge, the first edge is a straight line at the top surface of the first region, the second edge is a straight line perpendicular to the top surface of the first region, and the third edge is a curve connecting the first edge and the second edge.

12. The mask according to claim 4, wherein the first region is a cylinder, a vertical cross section, perpendicular to a plane where the light shielding layer is located, of the groove is bounded by a first edge, a second edge and a third edge, the first edge is a straight line at the top surface of the first region, the second edge is a straight line perpendicular to the top surface of the first region, and the third edge is a curve connecting the first edge and the second edge.

13. The mask according to claim 1, further comprising:
a partially light-transmissive film at the first opening pattern,
wherein the light shielding layer further comprises a second opening pattern.

14. The mask according to claim 1, wherein the quantity of the first opening pattern is more than one, and the mask further comprises a partially light-transmissive film at least part of the more than one first opening patterns.

15. The mask according to claim 1, wherein a width of the first opening pattern is greater than or equal to 30 μm.

16. The mask according to claim 1, wherein the transparent substrate is made of a glass material, and the light shielding layer is made of a metal material.

17. The mask according to claim 1, wherein the light converging structure is at the whole of the marginal region of the first region.

18. A method for manufacturing a display substrate, comprising:
forming a photo spacer with the mask according to claim 1.

* * * * *